United States Patent
Song et al.

(10) Patent No.: US 11,688,822 B2
(45) Date of Patent: Jun. 27, 2023

(54) OPTICAL COMPONENT AND ISOLATOR

(71) Applicant: ADVANCED PHOTONICS, INC., Tokyo (JP)

(72) Inventors: Xueliang Song, Tokyo (JP); Nozomu Sato, Tokyo (JP)

(73) Assignee: ADVANCED PHOTONICS, INC., Tokyo (JP)

( * ) Notice: Subject to any disclaimer, the term of this patent is extended or adjusted under 35 U.S.C. 154(b) by 0 days.

(21) Appl. No.: 17/765,863

(22) PCT Filed: Sep. 29, 2020

(86) PCT No.: PCT/JP2020/036752
§ 371 (c)(1),
(2) Date: Apr. 1, 2022

(87) PCT Pub. No.: WO2021/095378
PCT Pub. Date: May 20, 2021

(65) Prior Publication Data
US 2022/0328712 A1  Oct. 13, 2022

(30) Foreign Application Priority Data
Nov. 13, 2019 (JP) .................................. 2019-205843

(51) Int. Cl.
*H01L 27/15* (2006.01)
*H01L 29/26* (2006.01)
(Continued)

(52) U.S. Cl.
CPC ................ *H01L 31/12* (2013.01); *G02B 6/42* (2013.01); *H01S 5/0262* (2013.01); *H04B 10/802* (2013.01)

(58) Field of Classification Search
CPC ......... H01L 31/12; G02B 6/42; H01S 5/0262; H04B 10/802
See application file for complete search history.

(56) References Cited

U.S. PATENT DOCUMENTS

2001/0007603 A1* 7/2001 Sakurai ................ G02B 6/3865
385/60
2008/0187013 A1 8/2008 Guenter et al.
(Continued)

FOREIGN PATENT DOCUMENTS

CN 104024901 A 9/2014
CN 104519654 A 4/2015
(Continued)

OTHER PUBLICATIONS

International Search Report ("ISR") of PCT/JP2020/036752 dated Nov. 24, 2020.
(Continued)

*Primary Examiner* — Ismail A Muse
(74) *Attorney, Agent, or Firm* — Metrolex IP Law Group, PLLC

(57) ABSTRACT

A pair of optical components is used in an isolator that enables electric isolation. Each of the optical components includes: first lens portions arranged on different optical paths and transmitting light in a first direction; second lens portions arranged on different optical paths and transmitting light in the second direction orthogonal to the first direction; and a reflection portion reflecting, in the second direction, the light in the first direction transmitted through the first lens portion and guiding the light to the second lens portion, or reflecting, in the first direction, the light in the second direction transmitted through the second lens portion and guiding the light to the first lens portion The second lens portion included in one of the pair of optical components and the second lens portion included in the other optical component are spaced apart from each other and face each other.

3 Claims, 7 Drawing Sheets

(51) Int. Cl.
  *H01L 31/12* (2006.01)
  *H01L 33/00* (2010.01)
  *H01L 29/267* (2006.01)
  *G02B 6/42* (2006.01)
  *H01S 5/026* (2006.01)
  *H04B 10/80* (2013.01)

(56) References Cited

U.S. PATENT DOCUMENTS

| | | |
|---|---|---|
| 2009/0059987 A1 | 3/2009 | Walker et al. |
| 2014/0151585 A1 | 6/2014 | Hung |
| 2014/0211862 A1 | 7/2014 | Moghe et al. |
| 2014/0270662 A1 | 9/2014 | Morioka et al. |
| 2016/0282565 A1* | 9/2016 | Childers ............... G02B 6/403 |
| 2017/0097477 A1 | 4/2017 | Shibuya |
| 2019/0278034 A1* | 9/2019 | Saito .................... G02B 6/4255 |
| 2022/0052511 A1* | 2/2022 | Lu ........................ H01S 5/0267 |
| 2022/0131609 A1* | 4/2022 | Morita ............... H04B 10/2581 |
| 2022/0283389 A1* | 9/2022 | Yang .................... G02B 6/4242 |

FOREIGN PATENT DOCUMENTS

| | | |
|---|---|---|
| CN | 106104342 A | 11/2016 |
| JP | H01-220482 A | 9/1989 |
| JP | H2-161782 A | 6/1990 |
| JP | 2014-523556 A | 9/2014 |
| JP | 2015-179125 A | 10/2015 |
| JP | 2016-533633 A | 10/2016 |
| TW | 201423187 A | 6/2014 |
| WO | 2015/047619 A1 | 4/2015 |

OTHER PUBLICATIONS

Office Action (CNOA) dated Oct. 10, 2022 in a corresponding Chinese patent application.

* cited by examiner

OPTICAL COMPONENT AND ISOLATOR

TECHNICAL FIELD

The present invention relates to an optical component and isolator.

BACKGROUND ART

An isolator that is interposed between a host device and device is known (see, for example, Patent Document 1). Such an isolator electrically insulates a host device and device.

PRIOR ART DOCUMENT

Patent Document

Patent document 1: JP2014-523556

SUMMARY OF THE INVENTION

Problem to be Solved by the Invention

For example, in a field of medical equipment, equipment that may be touched by a human body is required to be completely isolated. Not only in the field of medical equipment, but also in various other fields, the isolation performance of an isolator is desired to be ensured. In addition, as data capacity increases, the communication speed is desired to be increased.

The present invention is made in consideration of the above-mentioned problem, and is intended to provide an optical component that enhances communication speed while ensuring insulation performance and an isolator equipped with the same.

Means to Solve the Problem (1) The present invention is an optical component that is featured to be used in pairs in an electrically isolating isolator, in which the paired optical components are used by placing opposing surfaces of the paired optical components against each other, including: a plurality of first lens portions that are provided on different optical paths from each other and transmit light in a first direction; a plurality of second lens portions that are provided on different optical paths from each other and transmit light in a second direction orthogonal to the first direction; a reflection portion that reflects light in the first direction transmitted through the first lens portion to the second direction to lead the light to the second lens portion, or that reflects light in the second direction transmitted through the second lens portion to the first direction to lead the light to the first lens portion; a convex portion on the opposing surface; and a concave portion on the opposing surface, wherein the second lens portions provided by one of the optical components of the pair and the second lens portions provided by the other optical component of the pair are arranged to face each other with a space between them, and the optical component is integrally molded with resin, the convex portion provided by one of the optical components of the pair is inserted into the concave portion provided by the other optical component of the pair, and the convex portion provided by the other optical component of the pair is inserted into the concave portion provided by one of the optical components of the pair so that both optical components of the pair are connected to each other.

(2) The present invention is also an isolator that is featured to include: the pair of the optical components as described in (1) above; a substrate that includes a first region and a second region, which is electrically insulated from the first region; a first light projecting unit that is located in the first region and irradiates light in the first direction toward the first lens portion provided by one of the optical components of the pair; a first light receiving unit that is located in the second region and receives light in the first direction transmitted through the first lens portion, which is provided by the other optical component of the pair and is located on the same optical path as the first light projecting unit; a second light projecting unit that is located in the second region and irradiates light in the first direction toward the first lens portion, which is provided by the other optical component of the pair and is located on the different optical path from the first light projecting unit; and a second light receiving unit that is located in the first region and receives light in the first direction transmitted through the first lens portion, which is provided by one of the optical components of the pair and is located on the same optical path as the second light projecting unit.

(3) The present invention is also an isolator that is featured to include: the pair of the optical components as described in (1) above; a substrate that includes a first region and a second region, which is electrically insulated from the first region; a light projecting unit that is located in the first region and irradiates light in the first direction toward the first lens portion which is provided by one of the optical components of the pair; and a light receiving unit that is located in the second region and receives light in the first direction transmitted through the first lens portion, which is provided by the other optical component of the pair and is located on the same optical path as the light projecting unit.

Effect of the Invention

According to the optical components described in (1) above and the isolator described in (2) and (3) above, the communication speed can be increased while ensuring the insulation performance.

EMBODIMENT FOR IMPLEMENTING THE INVENTION

An isolator 1 according to an embodiment of the present invention is described in detail with reference to drawings below. In the following description, a first direction D1 means a direction perpendicular to a substrate 2, and a second direction D2 means a direction parallel to the substrate.

Figure 1:
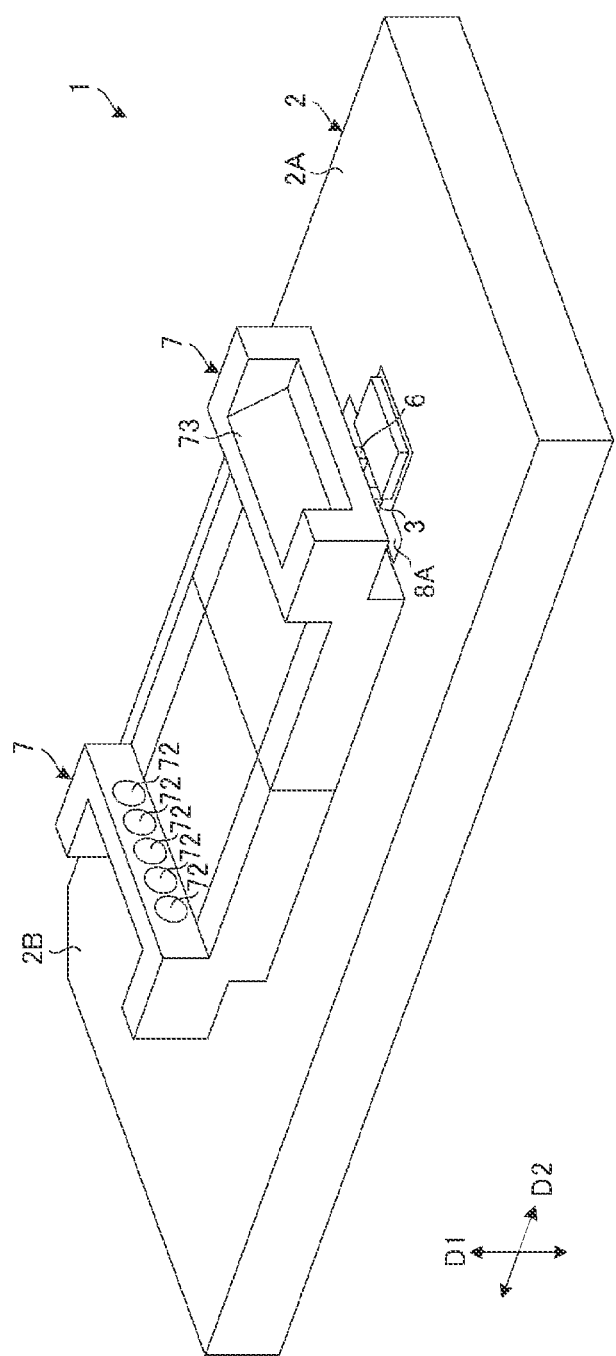
FIG. 1 is an external perspective diagram illustrating main components of an isolator according to an embodiment of the present invention.
Figure 2:
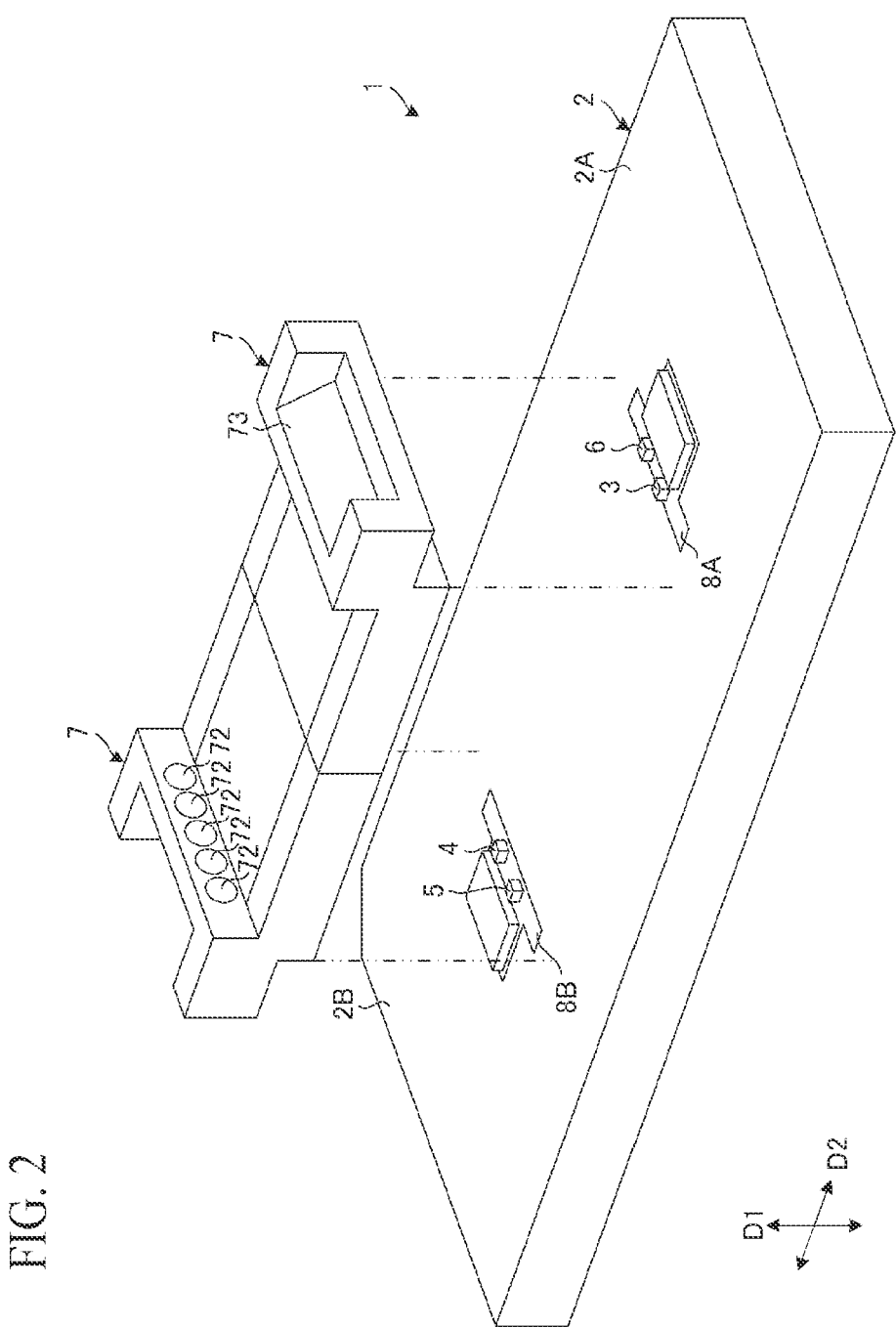
FIG. 2 is an exploded perspective diagram illustrating the main components of the isolator in FIG. 1.
Figure 3:
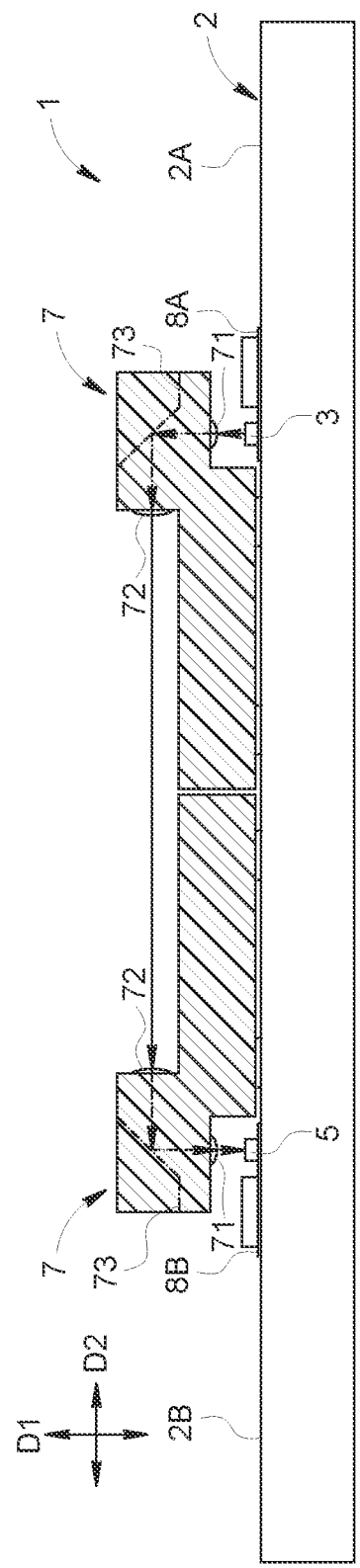
FIG. 3 is a diagram illustrating a front view of the main components of the isolator in FIG. 1.
Figure 4:
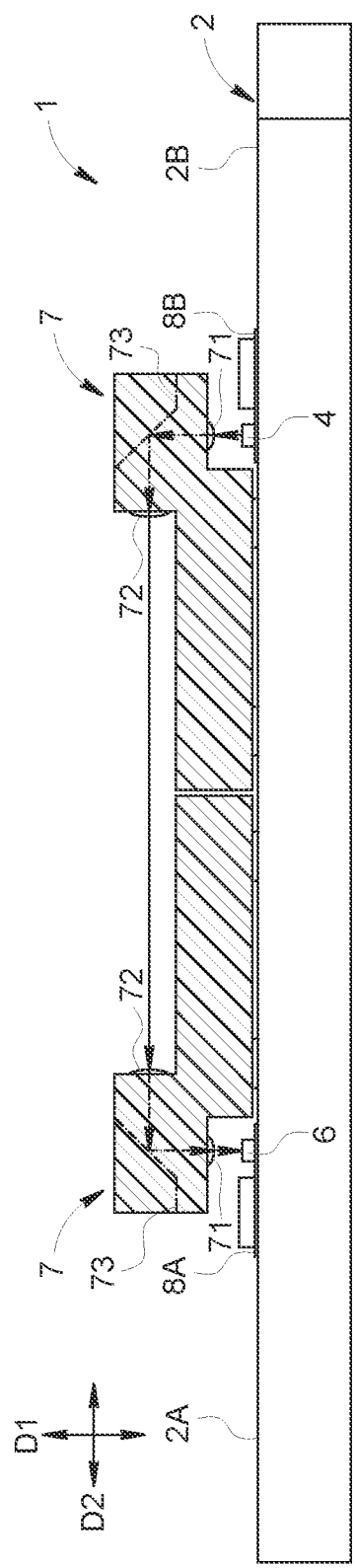
FIG. 4 is a diagram illustrating a rear view of the main components of the isolator in FIG. 1.
Figure 5:
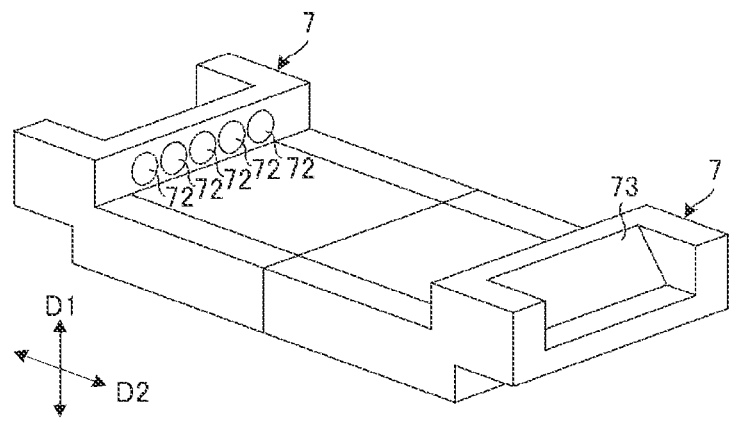
FIG. 5 is an external perspective diagram illustrating a pair of optical components that constitutes the isolator in FIG. 1 viewing from above at an angle.
Figure 6:
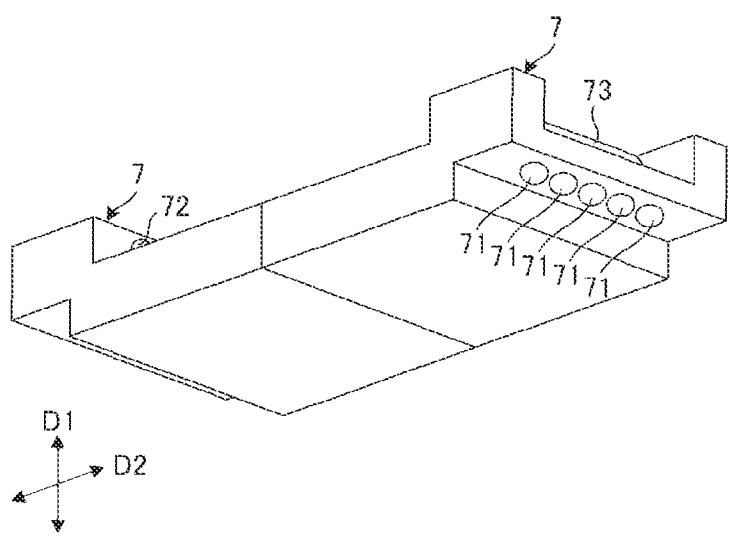
FIG. 6 is an external perspective diagram illustrating the pair of optical components that constitutes the isolator in FIG. 1 viewing from down at an angle.
Figure 7:
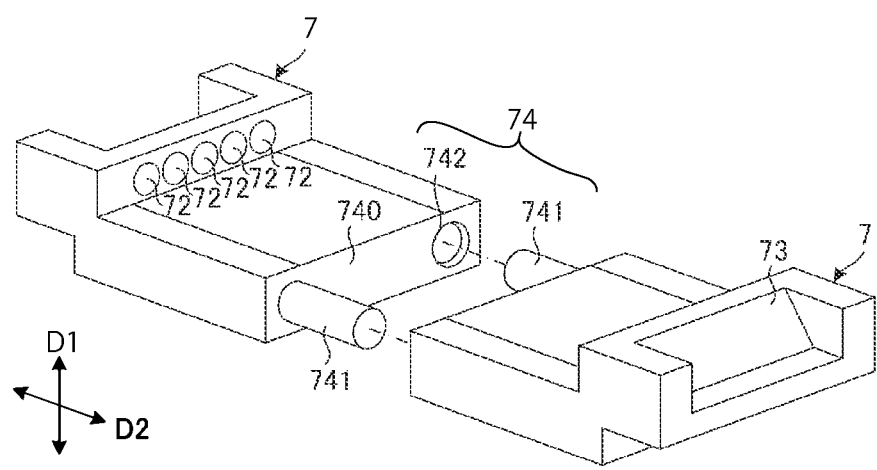
FIG. 7 is an exploded perspective diagram of the pair of optical components illustrated in FIG. 5.

First, configuration of the isolator 1 is described using FIGS. 1 to 7. FIG. 1 is an external perspective view illustrating the main components of the isolator 1 according to an embodiment of the present invention. FIG. 2 is an exploded perspective view illustrating the main components of the isolator 1 in FIG. 1. FIG. 3 is a front view illustrating the main components of the isolator 1 in FIG. 1. FIG. 4 is a rear view illustrating the main components of the isolator 1 in FIG. 1. FIG. 5 is an external perspective view illustrating a pair of optical components 7, 7 that constitutes the isolator 1 in FIG. 1 viewing from above at an angle. FIG. 6 is an external perspective view illustrating the pair of optical components 7, 7 that constitutes the isolator 1 in FIG. 1 viewing from down at an angle. FIG. 7 is an exploded perspective view of the pair of optical components 7, 7 illustrated in FIG. 5. In each figure, some of the components are omitted as appropriate to simplify the drawings.

The isolator 1 illustrated in FIGS. 1 to 7 electrically insulates a first region 2A and a second region 2B of the substrate 2, and also realizes optical communication between the first region 2A and the second region 2B of the substrate 2. Specifically, the isolator 1 includes: the substrate 2; lasers 3, 4; photodiodes 5, 6; a pair of optical components 7, 7; pads 8A, 8B; etc.

The substrate 2 includes the first region 2A and the second region 2B. The first region 2A and the second region 2B are electrically insulated from each other and also realize optical communication between each other by the pair of optical components 7, 7.

The laser 3 is mounted with the photodiode 6 on the pad 8A located in the first region 2A of the substrate 2. The laser 3 functions as the first light projecting unit to irradiate light in the first direction D1 to a first lens portion 71, which is provided by one optical component 7 of the pair and is located on a different optical path from the laser 4.

The laser 4 is mounted with the photodiode 5 on the pad 8B located in the second region 2B of the substrate 2. The laser 4 functions as the second light projecting unit to irradiate light in the first direction D1 to the first lens portion 71, which is provided by the other optical component 7 of the pair and is located on a different optical path from the laser 3.

The photodiode 5 is mounted with the laser 4 on the pad 8B located in the second region 2B of the substrate 2. The photodiode 5 functions as the first light receiving unit to receive light in the first direction D1 transmitted through the first lens portion 71, which is provided by the other optical component 7 of the pair and is located on the same optical path as the laser 3.

The photodiode 6 is mounted with the laser 3 on the pad 8A located in the first region 2A of the substrate 2. The photodiode 6 functions as the second light receiving unit to receive light in the first direction D1 transmitted through the first lens portion 71, which is provided by one optical component 7 of the pair and is located on the same optical path as the laser 4.

The optical component 7 is used in pairs in the isolator 1 that electrically insulates. The optical component 7 is used in a state in which both of an opposing surface 740 of both sides of the pair that face each other are butted against each other and connected to each other. One optical component 7 of the pair is located in the first region 2A of the substrate 2. The other optical component 7 of the pair is located in the second region 2B of the substrate 2. Specifically, the optical component 7 includes a plurality of first lens portions 71, a plurality of second lens portions 72, a reflection portion 73, and a connecting portion 74, and is integrally molded with resin.

The plurality of first lens portions 71 are arranged on different optical paths from each other and transmit light in the first direction D1.

Of the plurality of first lens portions 71 provided by one optical component 7 of the pair, one of the first lens portions 71 is positioned to face the laser 3, and the other one of the first lens portions 71 is positioned to face the photodiode 6.

Of the plurality of first lens portions 71 provided by the other optical component 7 of the pair, one of the first lens portions 71 is positioned to face the laser 4, and the other one of the first lens portions 71 is positioned to face the photodiode 5.

The plurality of second lens portions 72 are arranged on different optical paths from each other and transmit light in the second direction D2 orthogonal to the first direction D1.

The pair of optical components 7 are arranged so that each of the plurality of second lens portions 72 provided by one optical component 7 of the pair and each of the plurality of second lens portions 72 provided by the other optical component 7 of the pair face each other in a one-to-one manner with a space between them. The space between each of the plurality of second lens portions 72 of one optical component 7 of the pair and each of the plurality of second lens portions 72 of the other optical component 7 of the pair is an empty space.

The reflection portion 73 is located above the plurality of first lens portions 71 and to the side of the plurality of second lens portions 72. The reflection portion 73 reflects light in the first direction D1 transmitted through the first lens portion 71 to the second direction D2 and leads the light to the second lens portion 72, or reflects light in the second direction D2 transmitted through the second lens portion 72 to the first direction D1 and lead the light to the first lens portion 71.

The connecting portion 74 connects both optical components 7 of the pair to each other. Specifically, the connecting portion 74 has a convex portion 741 and a concave portion 742.

The convex portions 741 are provided on the opposing surfaces 740 of both optical components 7 of the pair facing each other. The concave portions 742 are provided on the opposing surfaces 740 of both optical components 7 of the pair facing each other. Both optical components 7 of the pair are connected each other by the convex portion 741 of one optical component 7 of the pair inserting into the concave portion 742 of the other optical component 7 of the pair and by the convex portion 741 of the other optical component 7 inserting into the concave portion 742 of one optical component 7.

The pad 8A is located in the first region 2A of the substrate 2 and mounts the laser 3 and the photodiode 6. The pad 8B is located in the second region 2B of the substrate 2 and mounts the laser 4 and the photodiode 5. These pads 8A and 8B are placed on the substrate 2 at the necessary distance from each other so as not to cause electrical discharge between them.

Next, a flow of light in the isolator 1 is explained using FIGS. 3 and 4.

First of all, as illustrated in FIG. 3, light in the first direction D1 irradiated from the laser 3 located in the first region 2A of the substrate 2 passes through the first lens portion 71 provided by the optical component 7 located in the first region 2A of the substrate 2 and enters the optical component 7 located in the first region 2A of the substrate 2. The light in the first direction D1 that enters the optical component 7 located in the first region 2A of the substrate 2 is reflected to the second direction D2 by the reflection portion 73. The light reflected to the second direction D2 by the reflection portion 73 passes through the second lens portion 72 and exits the optical component 7 located in the first region 2A of the substrate 2.

The light that exits the optical component 7 located in the first region 2A of the substrate 2 passes through the second lens 72 provided by the optical component 7 located in the second region 2B of the substrate 2 and enters the optical component 7 located in the second region 2B of the substrate 2. The light in the second direction D2 that enters the optical component 7 located in the second region 2B of the substrate 2 is reflected to the first direction D1 by the reflection portion 73. The light reflected to the first direction D1 by the reflection portion 73 passes through the first lens portion 71 and exits the optical component 7 located in the second region 2B of the substrate 2. The light that exits the optical component 7 located in the second region 2B of the substrate 2 enters the photodiode 5 located in the second region 2B of the substrate 2.

Also, as illustrated in FIG. 4, light in the first direction D1 irradiated from the laser 4 located in the second region 2B of the substrate 2 passes through the first lens portion 71 provided by the optical component 7 located in the second region 2B of the substrate 2 and enters the optical component 7 located in the second region 2B of the substrate 2. The light in the first direction D1 that enters the optical component 7 located in the second region 2B of the substrate 2 is reflected to the second direction D2 by the reflection portion 73. The light reflected to the second direction D2 by the reflection portion 73 passes through the second lens portion 72 and exits the optical component 7 located in the second region 2B of the substrate 2.

The light that exits the optical component 7 located in the second region 2B of the substrate 2 passes through the second lens portion 72 provided by the optical component 7 located in the first region 2A of the substrate 2 and enters the optical component 7 located in the first region 2A of the substrate 2. The light in the second direction D2 that enters the optical component 7 located in the first region 2A of the substrate 2 is reflected to the first direction D1 by the reflection portion 73. The light reflected to the first direction D1 by the reflection portion 73 passes through the first lens portion 71 and exits the optical component 7 located in the first region 2A of the substrate 2. The light that exits the optical component 7 located in the first region 2A of the substrate 2 enters the photodiode 6 located in the first region 2A of the substrate 2.

According to such an isolator 1, communication speed can be increased while ensuring insulation performance.

The present invention is not limited to the above described embodiments, but can be transformed in various ways to the extent that it does not deviate from its purpose and technical concept. In other words, the position, size, length, quantity, shape, material, etc. of each configuration can be changed as needed.

For example, the above-mentioned embodiment describes a case where the photodiodes 5 and 6 are provided as the first and second light receiving units, but the present invention is not limited thereto, and other photodetectors may be provided to receive light and convert light into electricity.

Alternatively, in the above-mentioned embodiment, the isolator 1 is described as an example of bi-directional communication between the first region 2A and the second region 2B in the substrate 2; however, the present invention is not limited thereto, and may be used to perform communication in only one direction between the first region 2A and the second region 2B in the substrate 2.

In other words, the isolator 1 consists of: a pair of optical components 7, 7; the substrate 2 that includes the first region 2A and the second region 2B, which is electrically insulated from the first region 2A; the laser (light projecting unit) 3 that is located in the first region 2A and irradiates light in the first direction D1 toward the first lens portion 71 provided by one optical component 7 of the pair; the photodiode (light receiving unit) 5 that is located in the second region 2B and receives the light in the first direction D1 transmitted through the first lens portion 71, which is provided by the other optical component 7 and located on the same optical path as the laser (light projecting unit) 3, and may not consist of the laser 4 and the photodiode 6.

DESCRIPTION OF SIGNS

1: Isolator
2: Substrate
2A: First region
2B: Second region
3: Laser (first light projecting unit, light projecting unit)
4: Laser (second light projecting unit)
5: Photodiode (first light receiving unit, light receiving unit)
6: Photodiode (second light receiving unit)
7: Optical component
71: First lens portion
72: Second lens portion
73: Reflection portion
74: Connecting portion
740: Opposing surface
741: Convex portion
742: Concave portion
8A, 8B: Pad
D1: First direction
D2: Second direction

The invention claimed is:

1. An optical component used in a pair of optical components in an electrically insulating isolator in which opposing surfaces of each optical component of the pair are placed against each other, comprising:
    a plurality of first lens portions that are provided on different optical paths from each other and transmit light in a first direction;
    a plurality of second lens portions that are provided on different optical paths from each other and transmit light in a second direction orthogonal to the first direction;
    a reflection portion that reflects light in the first direction transmitted through the first lens portion to the second direction and leads the light to the second lens portion, or reflects light in the second direction transmitted through the second lens portion to the first direction and leads the light to the first lens portion;
    a convex portion provided on the opposing surface; and
    a concave portion provided on the opposing surface, wherein
    the second lens portion provided by one of the optical components of the pair and the second lens portion provided by the other optical component of the pair are arranged so as to face each other with a space between them,
    the optical component is integrally molded with resin, and both optical components of the pair are connected to each other at the opposing surfaces by inserting the convex portion provided by one of the optical components of the pair into the concave portion provided by the other optical component of the pair and by inserting the convex portion provided by the other optical component of the pair into the concave portion provided by one of the optical components of the pair such that the plurality of first lens portions and the plurality of second lens portions of each of the optical components of the pair are provided away from the connected opposing surfaces.

2. An isolator comprising:
the pair of optical components according to claim 1;
a substrate that includes a first region and a second region, which is electrically insulated from the first region;
a first light projecting unit that is located in the first region and irradiates light in the first direction toward the first lens portion provided by one of the optical components of the pair;
a first light receiving unit that is located in the second region and receives light in the first direction transmitted through the first lens portion, which is provided by the other optical component of the pair and is located on the same optical path from the first light projecting unit;
a second light projecting unit that is located in the second region and irradiates light in the first direction toward the first lens portion, which is provided by the other optical component of the pair and is located on a different optical path from the first light projecting unit; and
a second light receiving unit that is located in the first region and receives light in the first direction transmitted through the first lens portion, which is provided by one of the optical components of the pair and is located on the same optical path as the second light projecting unit.

3. An isolator comprising:
the pair of optical components according to claim 1;
a substrate that includes a first region and a second region, which is electrically insulated from the first region;
a light projecting unit that is located in the first region and irradiates light in the first direction toward the first lens portion, which is provided by one of the optical components of the pair; and
a light receiving unit that is located in the second region and receives light in the first direction transmitted through the first lens portion, which is provided by the other optical component of the pair and is located on the same optical path as the light projecting unit.

* * * * *